United States Patent [19]
Van Praet et al.

[11] Patent Number: 5,918,035
[45] Date of Patent: Jun. 29, 1999

[54] METHOD FOR PROCESSOR MODELING IN CODE GENERATION AND INSTRUCTION SET SIMULATION

[75] Inventors: Johan Roland Van Praet, Wemmel; Dirk Lanneer, Landen; Werner Gustaaf Theresia Geurts, Rijkevorsel; Gert Lodewijk Huibrecht Goossens, Leuven, all of Belgium

[73] Assignee: IMEC vzw, Leuven, Belgium

[21] Appl. No.: 08/441,332

[22] Filed: May 15, 1995

[51] Int. Cl.$^6$ ........................................ G06F 3/00
[52] U.S. Cl. .................... 395/500; 395/702; 395/704; 395/705; 395/564
[58] Field of Search ............................ 395/500, 650, 395/800, 701–709, 564–568, 800.01, 800.02, 800.07, 800.1, 800.11, 800.16; 364/488–491, 194, 719, 735, 736, 146, 188, 192, 578

[56] References Cited

U.S. PATENT DOCUMENTS

| | | | |
|---|---|---|---|
| 5,513,122 | 4/1996 | Cheng et al | 395/500 |
| 5,522,063 | 5/1996 | Ashar et al. | 395/500 |
| 5,568,396 | 10/1996 | Banji et al. | 364/489 |
| 5,568,636 | 10/1996 | Koford | 395/500 |

OTHER PUBLICATIONS

C.G. Bell and A. Newell, *Computer Structures: Readings and Examples*, McGraw–Hill, New York, 1971, pp. 30–33.
R. Steven Glanville, et al., "A New Method for Compiler Code Generation," *Proceedings of the 5th Annual ACM Symposium on Principals of Programming Languages*, 1978, pp. 231–240.
David Landskov, et al., "Local Microcode Compaction Techniques," *Computing Surveys*, vol. 12, No. 3, Sep. 1980, pp. 261–294.
Robert A. Mueller, et al., "Flow Graph Machine Models in Microcode Synthesis," *16th Annual Microprogramming Workshop (Micro 16)*, ACM, 1983, pp. 159–167.
Alfred V. Aho, et al., "Code Generation Using Tree Matching and Dynamic Processing," *ACM Transactions on Programming Languages and Systems*, vol. 11, No. 4, Oct. 1986, pp. 491–516.
Lothar Nowak, et al., "Verification of Hardware Descriptions by Retargetable Code Generation," *26th ACM/IEEE Design Automation Conference*, Paper 28.2, 1989, pp. 441–447.
Jack W. Davidson, et al., "The Design and Application of a Retargetable Peephole Optimizer," *ACM Transactions on Programming Languages and Systems*, vol. 2, No. 2, Apr. 1990, pp. 191–202.
David Gordan Bradlee, "Marion Code Generation Construction System," Chapter 3 of Ph.D. *Thesis: Retargetable Instruction Scheduling for Pipelined Processor*, University of Washington, 1991, pp. 13–24.
A. Fauth, et al., "Automated Generation of DSP Program Development Tools Using a Machine Language Description Formalism," *Proceedings of IEEE, ICASSP '93*, IEEE, Minneapolis, 1993, four pages.
Johan Van Praet, et al., "Instruction Set Definition and Instruction Selection for ASIPs," *Symposium on High Level Synthesis*, Ontario, Canada, May 18–20, 1994, pp. 11–16.
Pierre G. Paulin, et al., "DSP Design Tool Requirements for Embedded Systems: A Telecommunications Industrial Perspective," *Journal of VLSI Signal Processing*, vol. 9, 1995, pp. 23–47.
A. Fauth, et al., "Describing Instruction Set Processors Using nML," *Proceedings of European Design & Test Conference '95*, Paris, France, Mar. 6–9, 1995, five pages.

*Primary Examiner*—Jacques H. Louis-Jacques
*Attorney, Agent, or Firm*—Knobbe, Martens, Olson & Bear, LLP

[57] ABSTRACT

A method of modeling a programmable processor is particularly adapted for use in an automatic retargetable code generator and instruction set simulator. The method represents the processor as a single graph with vertices and edges. The graph includes the instruction set of the processor and includes information about the hardware of the processor. The graph is linked to tools and libraries required to program and simulate the processor.

45 Claims, 11 Drawing Sheets

| 0 | arithmetic | | | | | indirect move | | | | | | | | | |
|---|---|---|---|---|---|---|---|---|---|---|---|---|---|---|---|
| | 1:2 | 3:4 | 5:6 | 7 | 8 | 9 | 10 | 11 | 12 | 13 | 14 | 15 | 16 | 17 |
| | alu operation | | | | 1 parallel move | | | | | | | | | |
| | 00 | +,-,&,/ | opd1 | opd2 | load, store | | source or destination register | | | agu +,- | address register | | index register | |
| | alu shift operation | | | | | | | | | | | | | | |
| | 01 | +,- >>,<< | opd1 | opd2 | 2 parallel moves | | | | | | | | | |
| | macc operation | | | | 2 loads, load // store | | source or destination register | | agu 1 +,- | address + index register 1 | | agu 2 +,- | address + index register 2 | |
| | 10 | *+,*-,+ | opd1 | opd2 | | | | | | | | | | | |
| | shift immediate | | | | | | | | | | | | | | |
| | 11 | opd | | imm. val. | | | | | | | | | | | |

| 10 | data moves with direct addressing |
|---|---|

| 11 | control flow instructions |
|---|---|

FIG.2

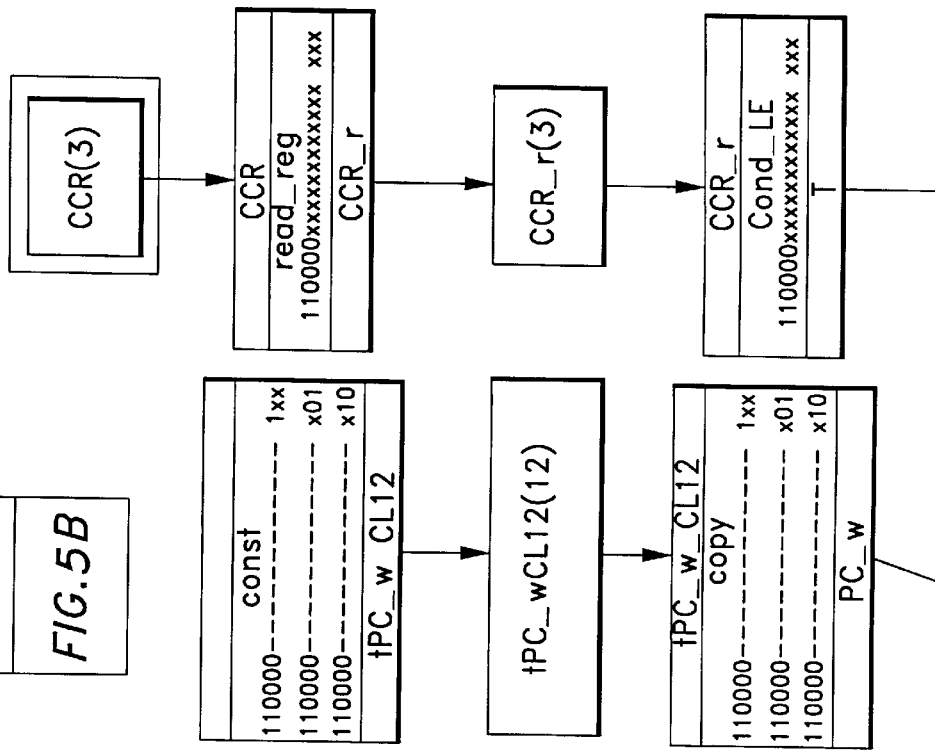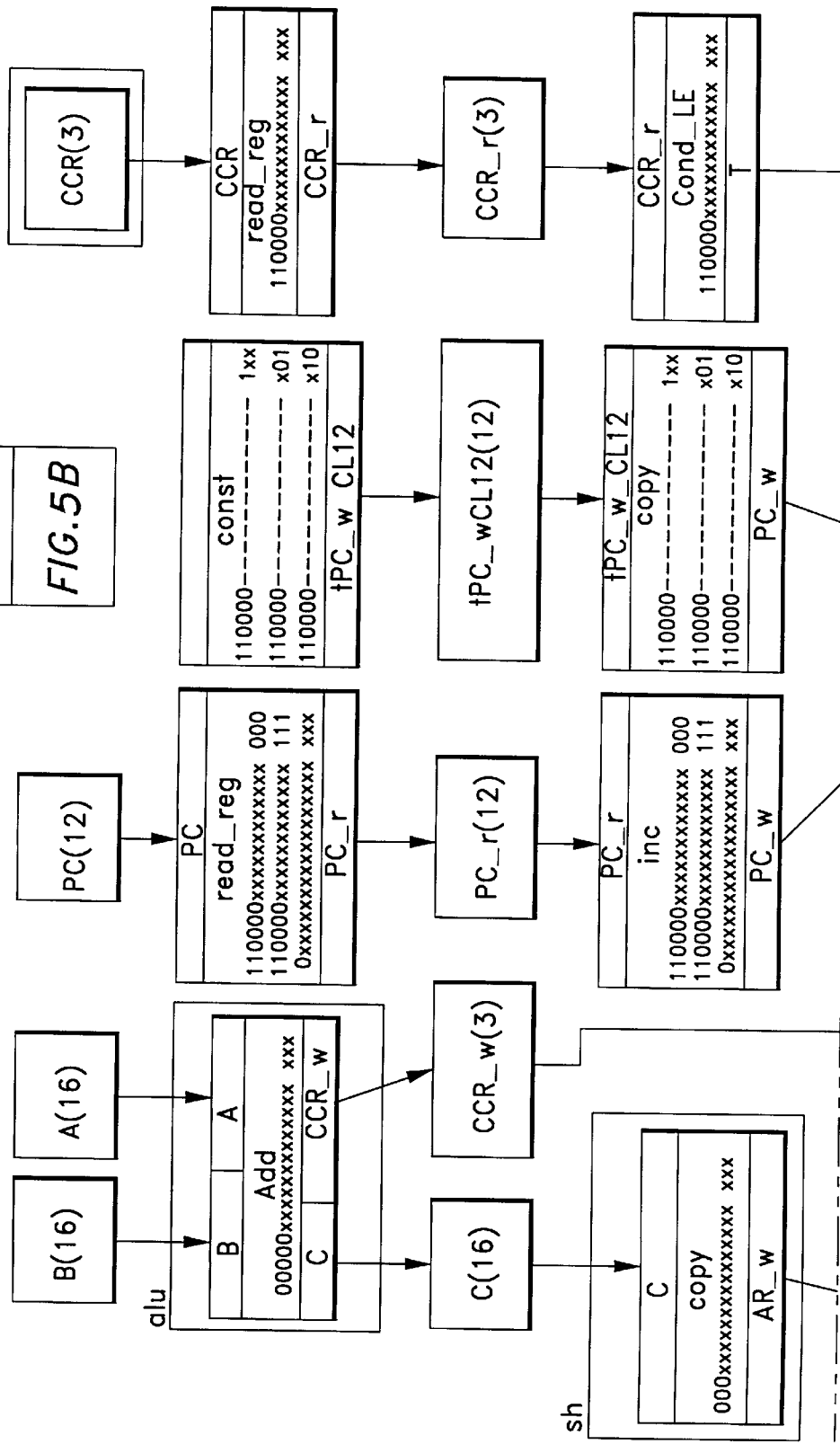
FIG. 5
FIG. 5A
FIG. 5B
FIG. 5A

METHOD FOR PROCESSOR MODELING IN CODE GENERATION AND INSTRUCTION SET SIMULATION

BACKGROUND OF THE INVENTION

1. Field of the Invention

The present invention relates to code generators and instruction set simulators for use as tools in developing software.

2. Description of the Related Art

Designers of electronic systems—as, for example, consumer electronics, communication systems and multimedia related products—more and more incorporate a programmable processor in their systems. Programmability offers them cost-effective hardware reuse and the flexibility to support last minute specification changes or to add new features to the system. The requirements of programmability, low cost and low power have resulted in a new class of application specific instruction set processors (ASIPs). These are a hybrid form of custom architectures and standard processors, offering an instruction set and hardware implementation which are optimized for a small number of applications.

A code generator and an instruction set simulator are the key tools to aid the designer when developing software. Because of the small number of applications to be mapped onto an ASIP, the effort to develop these tools should be as small as possible. Ideally, these tools should be reusable for a new ASIP without modification (i.e., they should be retargetable). A retargetable code generator has the extra advantage that late instruction-set changes are supported. It also aids in the design of an ASIP by providing quality measures (code size, execution time, resource utilization, and the like) on the mapping of applications to different hardware variations.

Code generators have different specific tasks to fulfill, of which the most important ones are code selection, register allocation and scheduling. Each of these tasks is implemented in a different program (called a code generator phase) which works on a different view of the processor. Processor models for existing code generators are just a set of these different views.

In the following, processor models and descriptions that are used in (retargetable) code generation for different types of processors will be reviewed.

The first retargetable code generators were designed for complex instruction set computers (CISCs). The architecture of these computers contains instructions with complicated operation patterns. Code selection was the most important task in these code generators and it performed register allocation and scheduling as a by-product. Code selection was implemented as tree pattern matching. As a consequence, the processor descriptions were tree or string grammars in which the production rules directly model the operation patterns available in the instruction set (Glanville and Graham, "A new method for compiler code generation," *Proc. 5th Ann. ACM Symp. on Princ. of Prog. Lang.*, pages 231–240, 1978; Aho and Tjiang, "Code-generation using tree matching and dynamic programming," *ACM Trans. on Prog. Languages and Systems*, Vol. 11, No. 4, pages 491–516, 1989). Some descriptions were more complicated and contained matching preconditions related to hardware peculiarities, data types, storage locations and addressing modes.

In other approaches, a machine description is an enumeration of all instructions along with their corresponding simple register transfers. Also, the application is transformed in these register transfers. Code selection is performed by combining register transfers in the application into groups to be performed by one instruction (Davidson and Fraser, "The design and application of a retargetable peephole optimizer," *ACM Trans. on Prog. Languages and Systems*, Vol. 2, No. 2, pages 191–202, 1980).

More recent code generators have been developed for reduced instruction set computers (RISCs). In this case, the register allocation and scheduling tasks are more important than code selection and also need their specific information. For example, the processor description of the Marion retargetable code generator for RISCs (Bradlee, "Retargetable instruction scheduling for pipelined processors," Ph.D. thesis at the University of Washington, 1991) contains a declaration of storage elements and other resources in addition to the instruction set enumeration. The register transfers are then annotated with scheduling and resource utilization information.

Recent retargetable code generators for ASIPs (Paulin, et al., "DSP tool requirements for embedded systems: a telecommunications industrial perspective," *J. VLSI Signal Processing*, Vol. 9, No. 1, 1995; Fauth and Knoll, "Automated generation of DSP program development tools using a machine description formalism," *Proc. IEEE of ICASSP 93*, Minneapolis, 1993) also use different views of a processor. Retargeting the code generator to another processor means rewriting all these views.

Some retargetable code generators already introduced a graph as a processor model. These graph models however do not contain sufficient information for all phases in a code generator. Mueller (Mueller and Varghese, "Flow graph machine models in microcode synthesis," *Proc. 16th Ann. Workshop on Microprogr.*, pages 159–167, 1983) used a graph model for performing the task of code selection by symbolic execution. For the processors he targeted, a by-product of this code selection was register allocation. Scheduling was performed separately, using a different view of the processor. Nowak (Nowak and Marwedel, "Verification of hardware descriptions by retargetable code generation," *26th ACM/IEEE Design Automation Conference*, 1989) extracts a so-called connection-operation graph from a structural processor description. The description is a detailed net-list of the processor, including the controller and the instruction decoder, but this is often not available to the software developer. The connection-operation graph maps all conflicts on the instruction word and does not support additional checks for hardware conflicts. As a consequence, bus conflicts must be treated separately. The model only supports single-cycle operations.

Retargeting the above mentioned code generators to a new processor involves rewriting all the phase specific processor models. This is a large effort, especially because all views must be kept consistent. To solve this problem, some (e.g., Fauth and Knoll) try to derive the models from one processor description language (nML). This approach needs an analysis program for each model which is still a lot of work to implement.

In code generation approaches of prior art, the phases use different models, each containing a different view of the processor. This makes it difficult to have them work closely together.

SUMMARY OF THE INVENTION

One aspect of the present invention is a method for processor modeling, using a graph based instruction set processor representation, which models a processor with all peculiarities of the architecture and the instruction set. The thus obtained model, called an instruction set graph, can be used in all phases of the code generator and thus eliminates the need for different phase specific machine descriptions such as, for example, an exhaustive enumeration of operation patterns for code selection or a listing of register classes for register allocation. All code generation phases find the information they need in the model without any analysis needed. The model can also be used in the instruction level simulator. This method, based on the instruction set graph, is not only applicable to ASIPs, but also to general purpose processors.

Phases in a code generator cooperate better when working on one global and complete model of the processor because of a better consistency, verifiability and efficiency.

The model produced in accordance with the method of the present invention is a bipartite graph, where one subset of the vertices contains the storage elements in the processor and the other subset of the vertices contain the micro-operations. A micro-operation is a primitive processor activity. The micro-operations are annotated with their enabling conditions, representing the values of the instruction word that activate them. Hardware conflicts in the processor are modeled by virtual storage elements, called transitories. By checking the enabling conditions and hardware conflicts, the code generator can search for valid operation patterns in the instruction set graph (i.e., patterns without conflicts).

This invention also provides a method to represent control flow operations, residual control, functional units, timing of operations, and different uses of the same register including data types. The representation is optimized for use by code generation and simulation methods.

The method also makes use of a library in the form of a decision tree on top of the instruction set graph to efficiently order possible alternatives and pass information from one code generation phase to another. Operations in the control data flow graph (CDFG, representing the application that code must be generated for) are always an instance of a library operation. The decision tree thus provides an efficient way to indicate for each CDFG operation which decisions in the code generation process have already been made and to look up all remaining possibilities.

The instruction set graph is derived automatically from an nML description of the processor that is written at the level of programmer's manuals. See, A. Fauth, et al., "Describing instruction set processors using nML," *Proc. European Design and Test Conference*, Paris, France, 1995; and Johan Van Praet, et al., "Instruction Set Definition and Instruction Selection for ASIPs," *Symp. on High Level Synthesis*, Ontario, Canada, May 18–20, 1994, the teachings of both of which are incorporated by reference herein. Retargeting the code generation and simulation programs therefore mainly involves writing a new nML description.

BRIEF DESCRIPTION OF THE DRAWINGS

The present invention will be described below in connection with the accompanying drawing figures in which:

FIG. 2 illustrates a schematic overview of the instruction set for the example processor;

FIG. 3, comprising

FIG. 5, comprising FIGS. 5A and 5B, illustrates a partial ISG with control flow modeling, on which the CDFG construct of FIG. 4 can be mapped;

DETAILED DESCRIPTION OF THE PREFERRED EMBODIMENT

An example processor

A small example processor will be used to illustrate the concepts of the instruction set graph model of the present invention. This processor is derived from a commercial processor for digital signal processing, namely the ADSP-2111 from Analog Devices. It should be understood, however, that the present invention is in no way restricted to this processor. The method is applicable to other commercial processors as well, and the method has also already been applied to different ASIPs.

Figure 1:
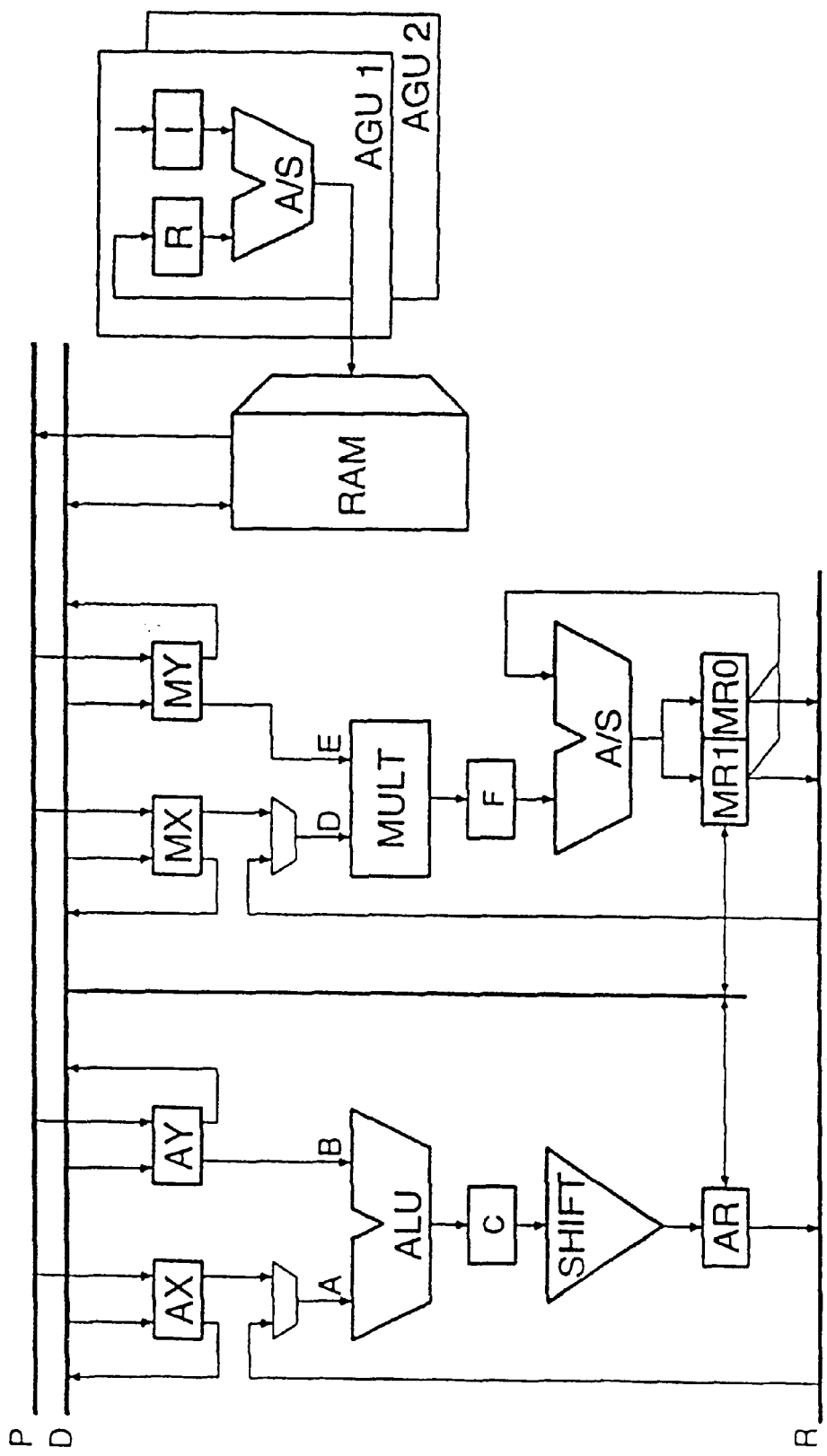
FIG. 1 represents the data path of a small example processor.

The data path (shown in FIG. 1) contains an ALU-SHIFT unit, consisting of an ALU connected through a pipeline register C to a shifter (SHIFT), and a multiply accumulate unit (MULT and A/S, with pipeline register F). Both units have their own input registers (AX, AY; MX, MY, respectively) and result registers (AR; MR1, MR0, respectively), and communicate with each other via the result bus R. The processor has a load/store architecture and can fetch two operands at a time by using both the program bus (P) and the data bus (D).

The instruction set is outlined in FIG. 2 and comprises three formats. The instruction word length is 18 bits (bits are numbered from 0 to 17, with 0 being the most significant bit). In the table, only format bits are shown. The first format, which deals with instructions incorporating an arithmetic operation with one or two indirectly addressed data moves in parallel, is detailed. One can see that the encoding excludes the parallel operation of the two arithmetic parts in the data path. The second format encodes data moves with direct addressing and the third one contains all control flow instructions.

Basic concepts of the instruction set graph

A processor model for retargetable code generation and instruction simulation must contain all information needed to generate correct and efficient code, and to simulate the content of every storage element during program execution in an instruction cycle accurate way. It must allow code generation phases to find out what operations and storage elements are available in the instruction set and how they are interconnected. Code generation and simulation programs must also know about all possible conflicts in a processor such as encoding restrictions and hardware conflicts. In short, the model must support efficient searches for valid patterns that translate into valid register transfers on the processor (which are enabled by a partial instruction). Also the timing and behavior of operations must be easily accessible.

The processor model should not, however, contain unnecessary details, nor predicates to guide the code generator phases or the simulator. Not needed are, for example, the details of the decoding tables, precise timing on the subphases of the clock and exact modeling of hardware of which the behavior does not introduce any conflicts.

If all information is contained in the processor model (i.e., no processor specific knowledge is coded in the code generator phases or in the simulator), retargeting the code generator or simulator consists of providing the generator or the simulator with a new processor model. If the model is sufficiently abstract (i.e., it does not contain phase-specific information), this is a relatively small effort.

A bipartite graph processor model

The instruction set graph (ISG) for the present invention is designed in accordance with the above requirements. It is a directed bipartite graph $G_{ISG}$ ($V_{ISG}$, $E_{ISG}$) with $V_{ISG} = V_{storage} \cup V_{ISGopn}$, where $V_{storage}$ contains the vertices that represent the storage elements in the processor and $V_{ISGopn}$ the vertices that represent its micro-operations. A micro-operation is a primitive processor activity. The edges in $E_{ISG} \subset V_{storage} \times V_{ISGopn} \cup V_{ISGopn} \times V_{storage}$ have end-points in different subsets and represent the connections between micro-operations and storage elements.

The algorithm for which code must be generated, is given as a control data flow graph (CDFG) which also takes the form of a bipartite graph $G_{CDFG}$ ($V_{CDFG}$, $E_{CDFG}$), $V_{CDFG} = V_{value} \cup V_{CDFGopn}$. In a simplified view, code generation is thus nothing else than mapping $G_{CDFG}$ ($V_{CDFG}$, $E_{CDFG}$) onto $G_{ISG}$ ($V_{ISG}$, $E_{ISG}$) with values in $V_{value}$ mapped on storage elements in $V_{storage}$ and the CDFG operations of $V_{CDFGopn}$ on corresponding micro-operations of $V_{ISGopn}$. The CDFG operations are in fact instances of the micro-operations in the ISG (see also the description below of the library of primitive operations).

In the ISG, a distinction is made between two kinds of storage elements. See, for example, David Landskov, et al., "Local microcompaction techniques," *ACM computing surveys*, Vol. 12 No. 3, pages 261–294, 1980, which is incorporated herein by reference. In particular, the two kinds of storage elements are defined as follows:

1. Static storage holds its value until explicitly overwritten. The same value can be read several times. Static storage has a certain capacity denoting the number of values it can store simultaneously. Examples are addressable (controllable) registers which have a capacity of one, and register files and memory which have a capacity larger than one.
2. Transitory storage passes a value from input to output with a certain integer delay. A transitory storage element will simply be called a transitory. A transitory can only contain one value. Examples are buses and wires, which have zero delay, and pipeline registers which have a delay of one cycle.

Memories and registers are included in the ISG as they occur physically in the architecture. Transitory storage elements, on the other hand, are not necessarily related in a one-to-one way to physical interconnect resources in the architecture. As will be described below in the description of modeling hardware conflicts via transitories, a more abstract model may be used, as long as it allows for the correct representation of the processor behavior, including the hardware conflicts. Both kinds of storage elements (i.e., the set $V_{storage}$) together define a skeleton of the target machine structure. The other set of nodes ($V_{ISGopn}$) correspond to micro-operations and describe how and for which instructions, values in the storage elements can be transformed into other values in other storage elements. The transformation behavior is defined in a library of primitives (see the description below of the library of primitive operations) while the connections to storage elements are given by the edges in the ISG. In this way, edges in the ISG model the data flow in the processor. All operations are between transitory storage elements, except for register and memory read/write operations which connect static with transitory storage elements.

For each bit pattern in the instruction register, the processor executes a number of micro-operations. Alternatively, it can be seen that a certain micro-operation is enabled by different instruction word settings. In the ISG, these settings (which are a sum-of-products of the instruction word bits) are stored with the operation in a cubic representation (Hill and Peterson, "Switching theory and logical design," Wiley, pages 138–141, 1981) (i.e., as a set of bit-strings) and called the enabling condition of the operation.

Each set of micro-operations out of the ISG can be checked for encoding conflicts by verifying that the intersection of their enabling conditions is not empty. This non-empty intersection of enabling conditions is again an enabling condition consisting of bit-strings. Each of these bit-strings, together with the involved set of micro-operations, corresponds to a partial instruction.

Figure 3A:
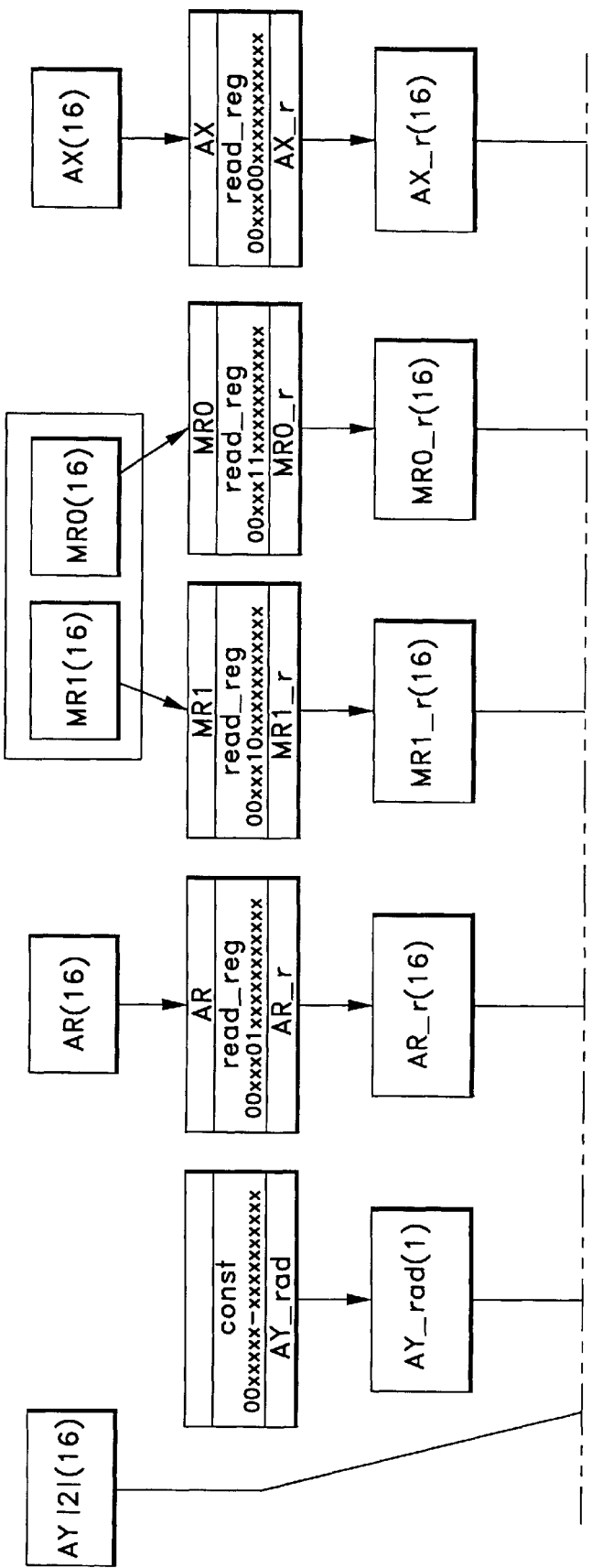
FIGS. 3A, 3B and 3C, illustrates the instruction set graph for the (partial) instructions using the ALU in the example processor.
Figure 3B:
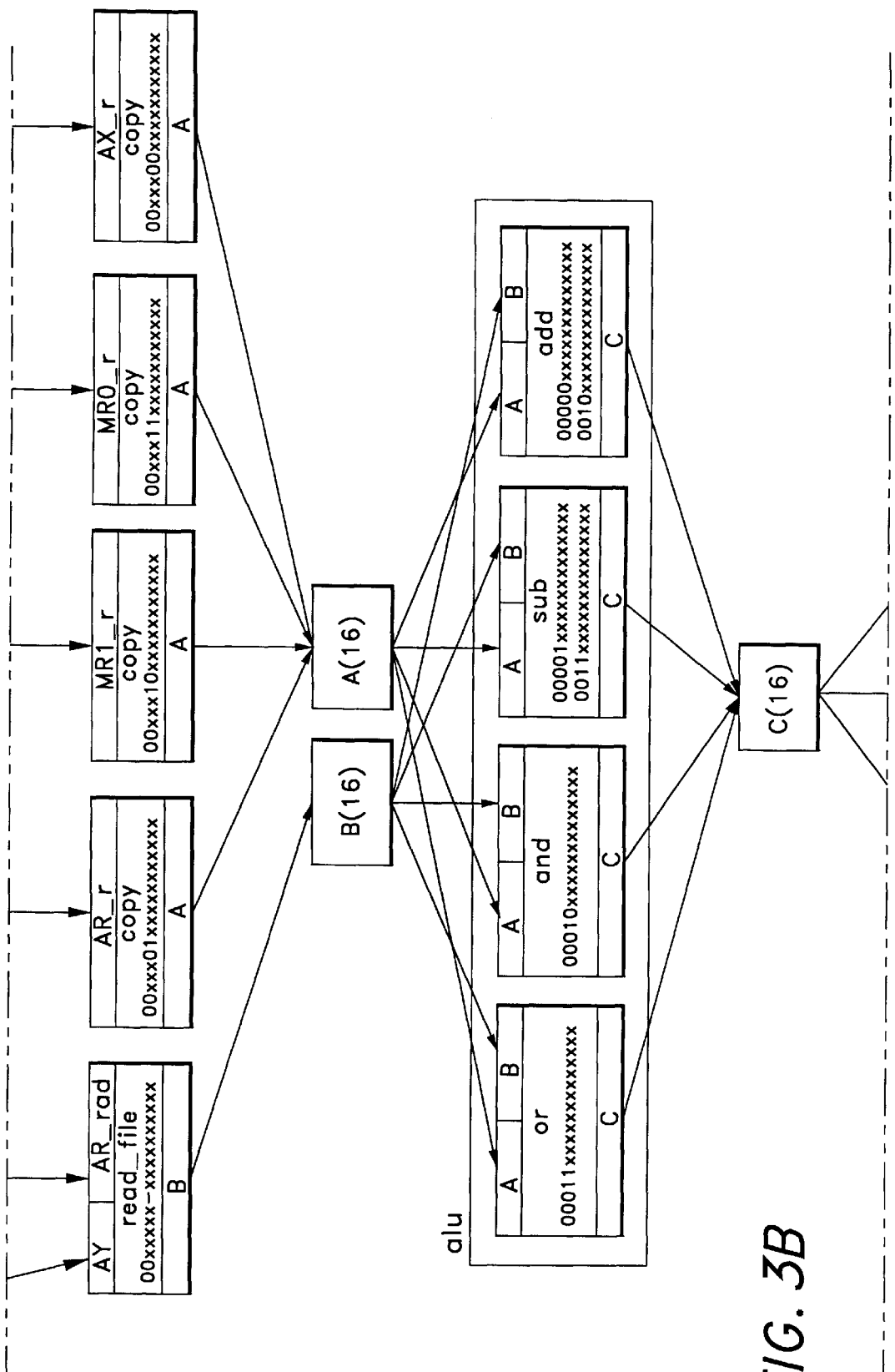
Figure 3C:
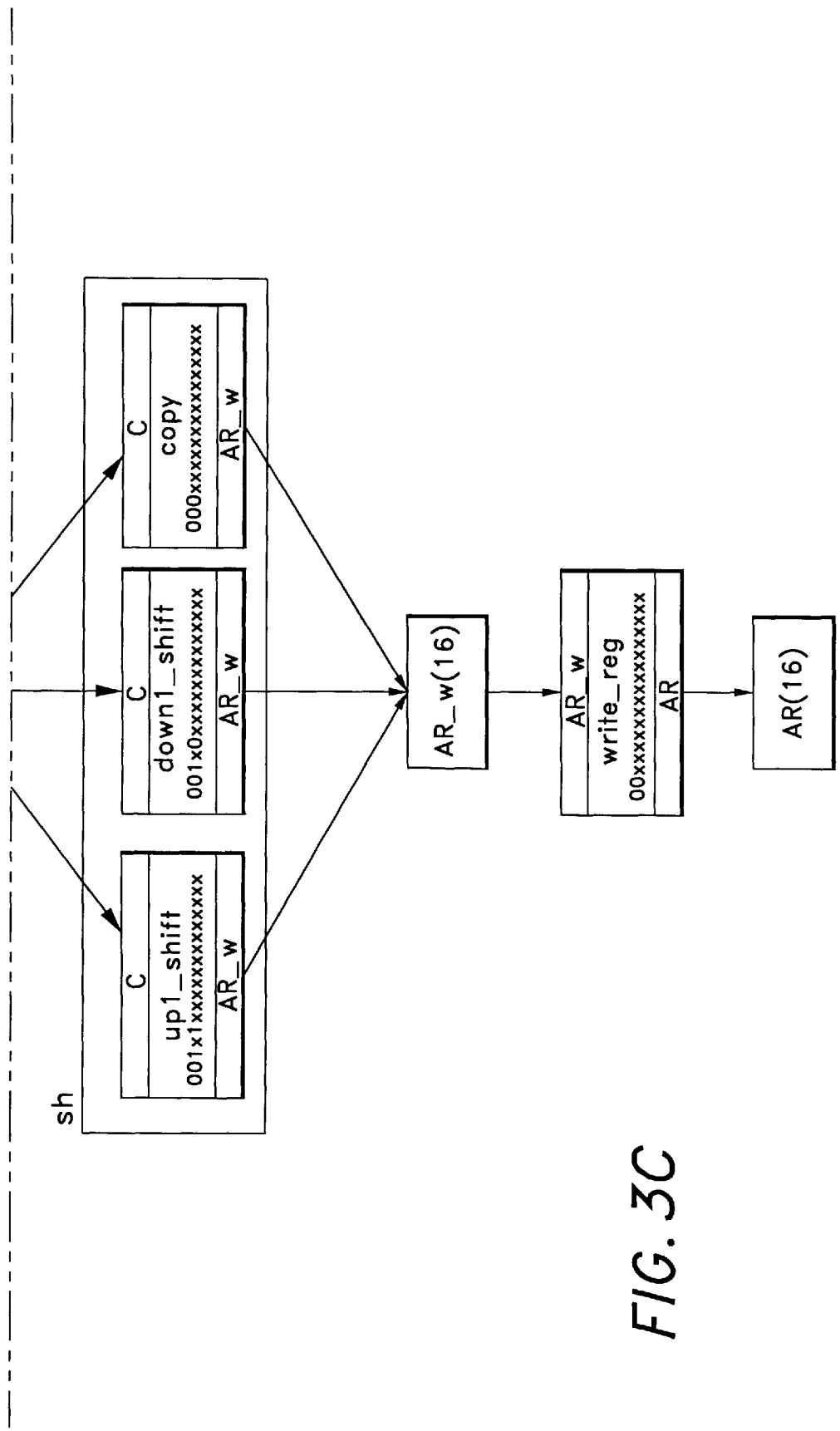

A part of the ISG representation for an exemplary processor is depicted in FIG. 3. For reasons of readability the nodes representing static storage are duplicated and can be found at the top and the bottom of the figure. The other storage nodes (with a label containing the number of bits between parentheses) are transitories. In the enabling conditions "x" means don't care and "-" stands for an undefined constant. Copy operations just copy values from one transitory to another and are used in the ISG in different situations. A multiplexer can be modeled as a set of copy operations with a common output transitory and with conflicting, mutually exclusive enabling conditions. Read and write ports of registers are modeled as transitories (see the description below of the modeling of hardware conflicts via transitories) with read_reg and write_reg operations connecting them to the registers. The read_file operation needs an extra address input.

Additional modeling issues

Functional units

Functional units in a conventional net-list model are defined as units having ports which are connected to nets. Operations are defined on these functional units, with their arguments bound to the ports. In the ISG, arguments of operations are directly bound to transitories. Functional units then are optional, they are just a set of operations that are assigned to some data path operator. The specification of functional units is particularly useful when a net-list must be derived from the ISG. The latter is necessary for automatic processor implementation. In FIG. 3, two functional units are shown: alu and sh.

Aliases

A storage element in reality is a reference to a list of physical storage bits which one can locate on the processor, the first being the most significant bit and the last being the least significant bit of the storage element. A particular physical storage bit can be part of more than one storage element and thus be contained in more than one list (possibly of different lengths).

For example, in the example processor, the 32 bits forming the accumulator register MR are also part of one of the two 16-bit registers MR0 and MR1. The instruction set contains register transfers involving each of these registers. Another example is that in a processor often some registers are memory mapped. In this case, the same physical storage bits can be accessed by a read or write operation to the named register, or by a load or store operation to a memory location.

In the ISG, (parts of) storage elements that share the same physical storage bits are linked by a so-called alias relationship. There will, for example, be an alias relationship between MR0 and the lower half of MR and between MR1 and the upper half of MR. Storage elements related by aliases just provide a convenient way to name lists of physical storage bits; a code generator phase must always bring conflicts and constraints on these storage elements back to the physical storage bits involved.

Timing

In the ISG, a micro-operation has no inherent delay. If needed, delay is attributed to a storage element at its output instead. This delay represents the relative clock cycle at which operands/results of the micro-operations connected to the storage elements are consumed/produced. Transitories have a default delay of zero but other delay values can be specified.

Application of ISG model

Modeling hardware conflicts via transitories

A code generator must not only check for encoding restrictions between operations, but also for hardware conflicts, which are not always prevented by the encoding conflicts. For example, hardware conflicts may occur between operations of orthogonal instruction fields. Such instructions are called "illegal" instructions. In the case of pipelined processors, hardware conflicts can even occur between operations of different instructions and timing profiles must be taken into account. Encoding conflicts are checked by intersecting the enabling conditions (see the description above of the bipartite graph processor model). Hardware conflicts are modeled as access conflicts on transitories: each cycle, only one operation is allowed to write onto a transitory. To illustrate the power of modeling hardware conflicts via transitories, two examples of illegal instructions will be considered.

Different tristate drivers can be connected to the same bus and are not allowed to write to it during the same cycle, even not when an instruction encoding allows it. To prevent the code generator from generating such an instruction, the bus is modeled as a transitory and the tristate drivers as copy operations. The conflict then turns into an access conflict to the transitory (i.e., a bus conflict) which can be checked and avoided by the code generator. This resembles the way a multiplexer is modeled in the ISG, but, in the case of a bus conflict, the enabling conditions of the copy operations are not exclusive. It should be noted that in the ISG of FIG. 3 the result bus has not been modeled explicitly (it is merged with the multiplexer) because no result bus conflicts occur with the example instruction set.

Read/write ports of static storage are also modeled as transitories in order to make the code generator check for port conflicts. Port conflicts occur when two operations try to access a storage element via the same port in the same cycle.

Residual control

In the foregoing description of the basic concepts of the instruction set graph, only micro-operations were described that are totally controllable by the instruction word register. A processor however often has one or more mode registers containing bits which influence its behavior. A common example in DSP processors is a saturation bit, indicating whether an adder must perform saturating or normal additions, which have a different behavior when an overflow would occur.

When the execution of an operation does not solely depend on the bit settings in the instruction register but also on bit settings in a mode register, that operation is said to be residually controlled.

In the ISG, residual control is modeled by introducing a virtual extended instruction register as the concatenation of the instruction register and the residual control registers. The enabling conditions of operations now contain bits of this virtual instruction register. A link is maintained from bits in the virtual instruction register to the physical registers containing them by means of the aliasing mechanism. Thus, the code generator can determine which register is controlling a certain operation, and must therefore be written in order to enable it.

Modeling of control flow

Operations in a processor usually do not only generate a result, but also set flags depending on properties of the result. These flags are stored in the condition code register (CCR) and can be used by other operations to implement decision making. Operations making use of these flags can be divided in two classes: operations changing the control flow and conditionally executable operations.

In the ISG, a simple controller model is normally described, with instructions stored in memory and where the program counter (PC) holds the address of the instruction being fetched. That instruction will be issued in the following cycle. The program flow executed on the processor is changed by writing a new value to the PC. Operations changing the control flow can be dependent on the value of the CCR. In the ISG, separate storage elements are introduced representing the PC and the CCR; in addition all operations that modify the PC value are explicitly defined.

The operations which change the control flow, depending on the CCR, are modeled at different levels.

Figure 4:
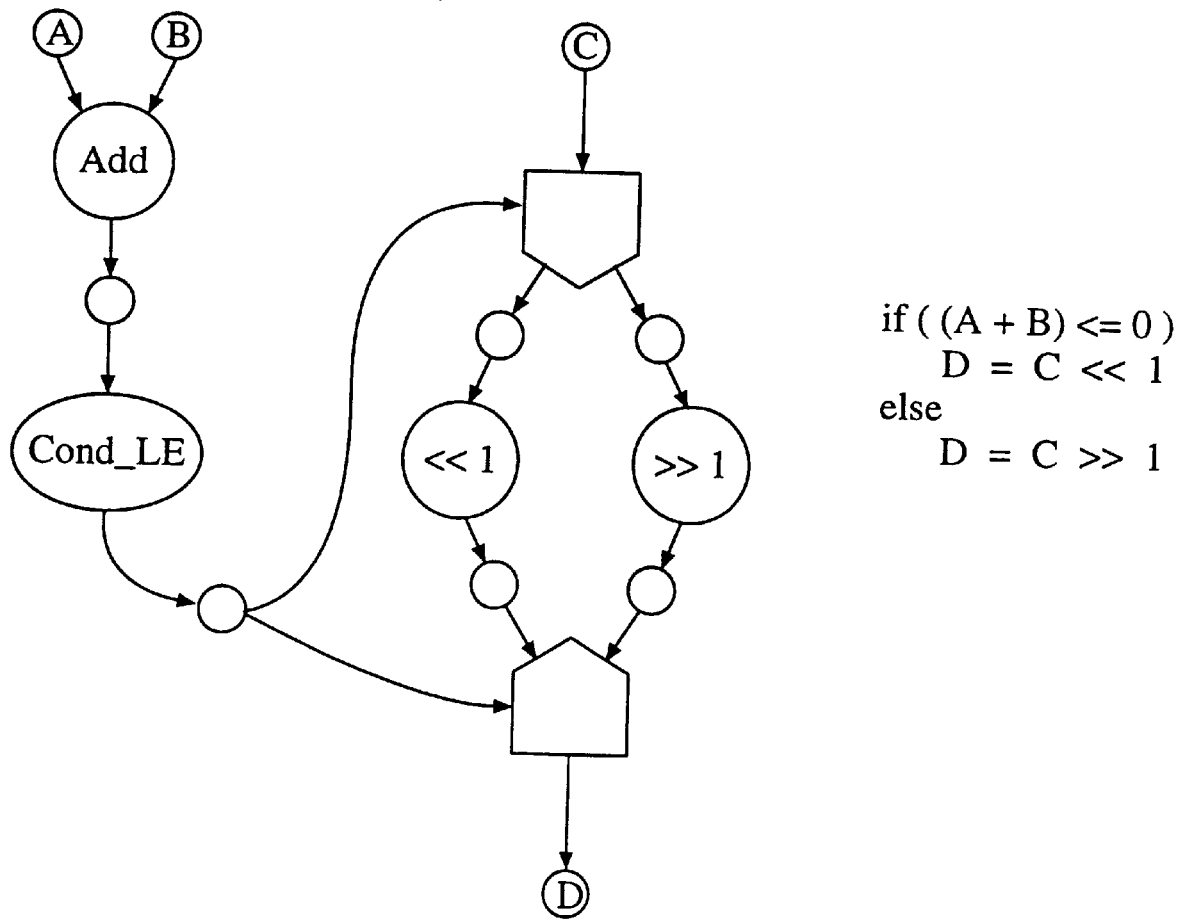
FIG. 4 represents a CDFG construct with a conditional branch.

For the purpose of this description, it can be assumed that the application program is represented by a CDFG (i.e., without introducing branch labels or other references to the PC). A small CDFG example is shown in FIG. 4. Thus, code generation phases working with the CDFG must not know about the PC value. They must however know that a certain conditional construct makes use of the condition code register bits. To this extent, control operations that take as inputs those bits of the CCR on which the conditional construct depends and have a one bit output, are placed in the ISG (see example below). Delays in the controller can be modeled by adding transitories with non-zero delays in this path. During code selection the condition calculation of a conditional construct is bound to such an operation. The scheduling phase can thus find out about the dependency between operations in a conditional construct and the operation setting the condition code bits by looking at the condition calculation of that construct.

In the assembler stage of the code generator, state assignment has to be done and each instruction is bound to a certain PC value. Then the branch target has to be specified in the instruction of the control operation. For the instruction level simulator, the PC and the assignments to it also have to be modeled in the ISG. These assignments to the PC or increments of the PC are operations which are residually controlled by the CCR, as will be made clear in the following example.

Figure 5B:
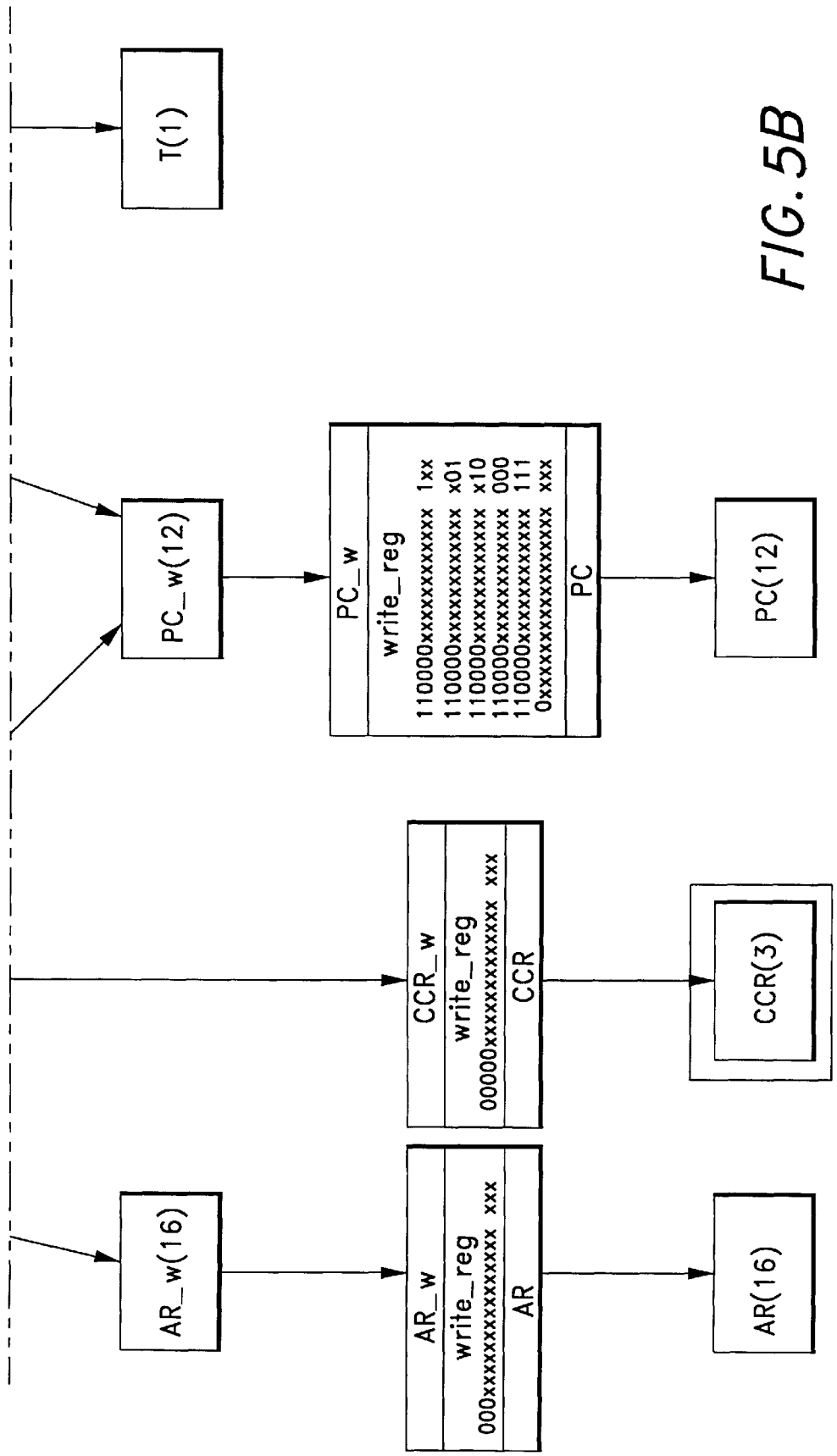

A control instruction for the example processor will now be described. For the purpose of this description, it can be assumed that the processor has a condition code register containing three flags (Z: zero, N: negative and V: overflow). A condLE operation (less than or equal to zero) takes the CCR as input and generates a one bit output which is equal to Z v (N⊕V). The instruction of the condLE control flow operation starts with the format bits 110000. This operation is used, for example, to bind the condition calculation of an if (condLE) . . . else . . . construct. In FIG. 5, it can be seen that the add operation writes the CCR. The CCR is an input for the condLE operation. Thus for this construct, the PC must receive a new target when Z v (N⊕V), otherwise it must be incremented. One can verify this in the ISG of FIG. 5 (inc and copy operation) by examining the enabling conditions, in which the last three bits represent the CCR.

An if (condition) . . . construct with one operation can sometimes be replaced in the CDFG by an equivalent operation which is conditionally executable. Conditionally executable operations are only executed when a certain condition is true, otherwise a nop is performed. In the ISG, they are modeled as residually controlled operations.

Data types

Physically, storage elements contain bit strings of a certain length. Behavioral specifications often make use of more specific data-types, such as, for example, an unsigned integer or a signed fractional number, which may have the same word-length. The type of these values is important for the behavior of certain operations.

A single list of physical storage bits can contain several more specific data-types. In the ISG, different vertices are then introduced for one list of physical storage bits, and each of the vertices is annotated with one of the data types. Alias relationships between these vertices indicate that they represent the same physical storage bits. In this way, a hierarchical type system, as proposed by Bell and Newell, "Computer Structures: Readings and Examples", McGraw Hill, pages 30–33, 1971, which is incorporated by reference herein, can be introduced for each storage element.

A library of primitive operations

As discussed above with respect to the bipartite graph processor model, a CDFG operation is an instance of a micro-operation in the ISG. This relation must however be generalized, because at the start of the compilation process, operations in the CDFG are instances of more abstract operation types.

The abstract operations and the ISG operations are stored in a library, and are the primitive operations of which CDFG operations are instances. In fact, the library is a decision tree with vertices and branches which is used in the mapping of a CDFG to the ISG. Vertices correspond to primitive operations, and branches represent possible refinements of primitive operations according to alternative mapping possibilities in the optimization space. Before invoking the code selection phase, CDFG operations are instances of operations at a high level in the library. These operations can still be implemented in different ways in the ISG and their arguments are not yet bound to storage elements. The phases in the code generator then refine these CDFG operations until they are instances of library leaf operations. At each intermediate stage, the type of a CDFG operation shows which code generation decisions have already been taken and which properties of the operations are already fixed.

Figure 6:
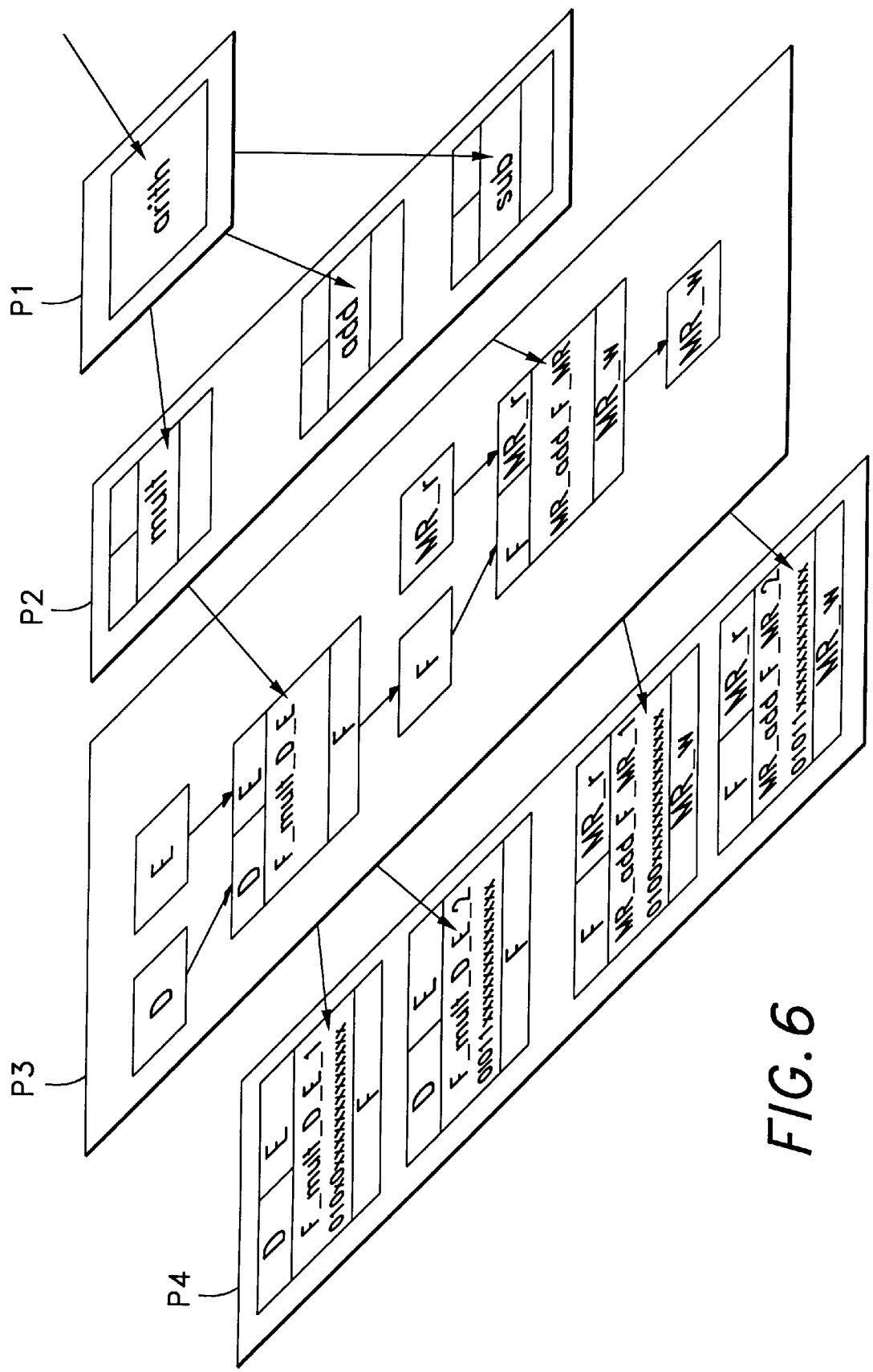
FIG. 6 illustrates a schematic view of the relation between the instruction set graph and the library, forming a decision tree for the code generation method.

FIG. 6 illustrates a schematic view of the hierarchy formed by the decision tree in the library, represented by first, second, third and fourth planes (P1, P2, P3 and P4, respectively). The third plane P3, where the operations are connected to transitories, is the ISG. The ISG is thus completely integrated with the library. The children of an ISG operation, in the bottom plane P4, contain the enabling conditions. In FIGS. 3 and 5, the micro-operations in the ISG were in fact shown with the name of their parent and the instruction settings of all their children in a list.

When retargeting the code generator the top part of the library, containing the abstract operations, is typically reused. The layers of the ISG and below are generated out of a new nML description, as explained in the following section.

Specification of the ISG

In principle, a designer could directly provide the full ISG description to be used by the code generator and instruction simulator programs. Due to the amount of detail in a typical ISG, this would however be cumbersome. Instead a more compact and user-friendly design entry level is provided by specifying a processor with the nML description formalism described in Fauth, Van Praet and Freericks, "Describing instruction set processors using nML," *Proc. European Design and Test Conference*, Paris, France, 1995, incorporated by reference herein, and using the so-specified processor as a front-end to the ISG model of the present invention.

Although nML contains all the information needed for code generation, it is not a processor model. It does not explicitly show the connectivity of the data-path, nor does it allow efficient look up of all operations with a certain behavior. The nML description formalism is designed to facilitate the task of describing a processor. Its grammar structure aids a human to have an overview of the performed actions in each instruction part, but cannot be efficiently used by code generation phases. Hence, the need exists for the instruction set graph with a structure fitting the graph of the application to be programmed and with the type of hierarchy which is useful for a computer program.

The nML front-end is partly based on prior art (see, for example, the description of the basic concepts of nML set forth below), enhanced with new developments (see, for example, the description of adding a structural skeleton to nML, set forth below) to contain all information needed to generate the complete ISG.

Basic concepts of nML

An nML description is written at the level of a programmer's manual. Therefore, most implementation details of the actual machine are hidden, but it contains all information needed for code generation. An enumeration of both the memory locations and the instruction set of the processor are the basic ingredients of an nML description.

Complex architectures may allow hundreds of legal combinations of operations and addressing modes to compose the instruction set. The size of a description can however be reduced by introducing hierarchy and by sharing similarities among a variety of instructions. In an nML description, a grammar based approach is used for that purpose. The production rules in the grammar introduce the structure of the instruction set into the processor description.

OR-rules are production rules which indicate alternative partial instructions, a different interpretation of fields in the instruction word.

AND-rules indicate the composition of orthogonal partial instructions into a bigger part, a concatenation of independently controllable fields. Also the leafs in the hierarchy are AND-rules.

Each of the strings which can be derived from the grammar, symbolizes one instruction of the processor. By itself, however, such a string contains no useful information. All semantic aspects are held in the (predefined) attributes of the production rules. The action attribute contains the behavior of the instruction part, described in terms of the composing rules or with register transfers. The image attribute holds the values to set the instruction word fields and the syntax attribute describes the assembly language syntax.

Figure 7:
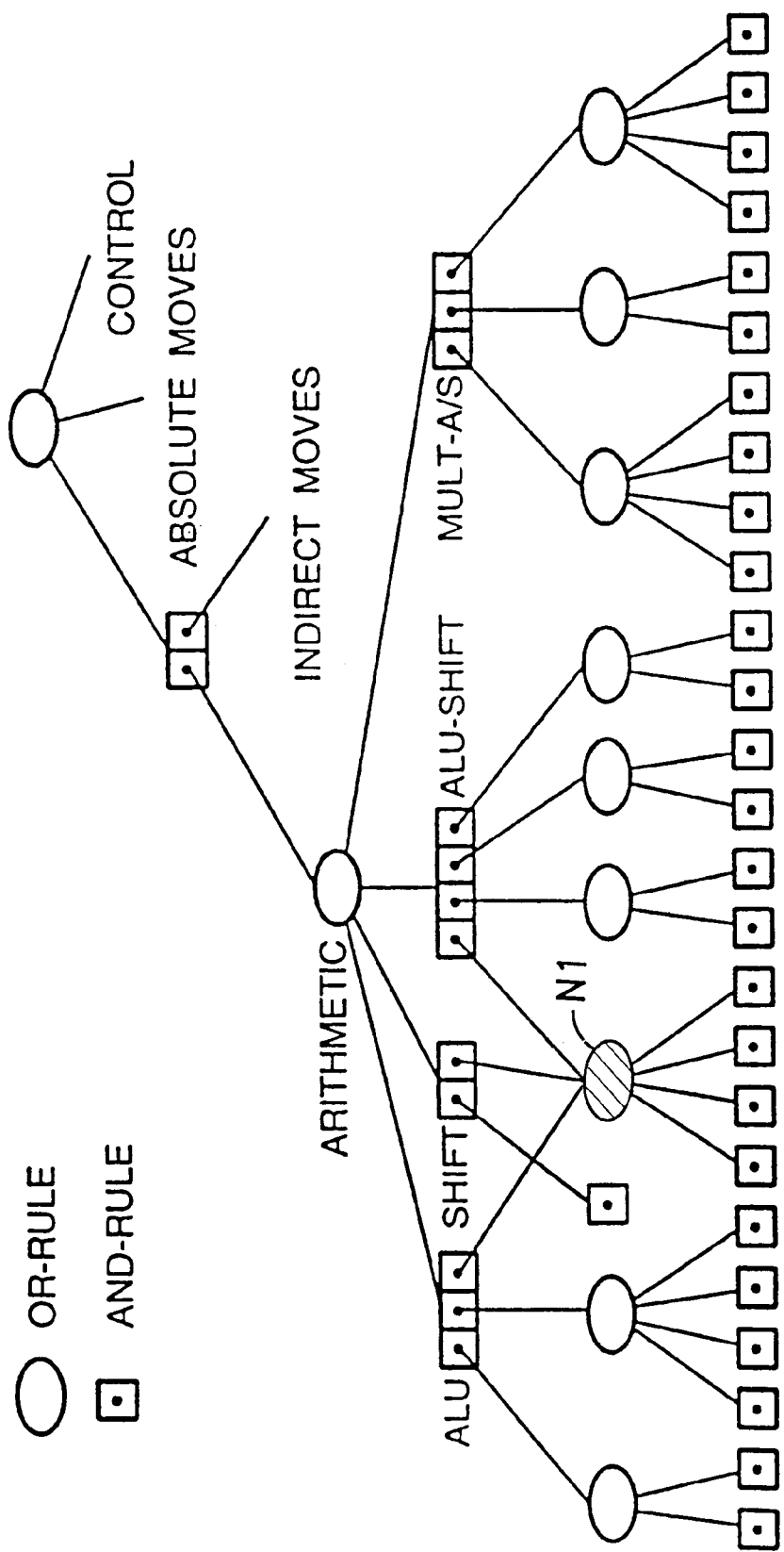
FIG. 7 depicts the hierarchy which is present in the nML description of the example processor.

In nML, addressing modes are defined as mode-rules having an extra value attribute. This value is an expression that results in a memory location. When a mode-rule is referenced in the action attribute of another rule, it is replaced by its value. A mode-rule can be either an AND-rule or an OR-rule The hierarchy introduced by the attributed grammar makes an nML description very concise, easy to write and easily maintainable. The structure in the nML description of the example processor of the present invention is shown in FIG. 7.

An nML description is typically constructed by analyzing the instruction set of the target machine proceeding top-down. For the present example, the three formats are easily reflected in the nML description by capturing the top-level classification in an OR-rule:

opn instruction=computemove|moveabs|ctrl

Either a computation with a data move in parallel, a sole data move with absolute addressing or a control-related instruction can be executed. By further zooming into the first category of instructions, two orthogonal parts are found (i.e., two parts of the instruction that can be controlled independently). This is described in an AND-rule:

opn computemove(c:compute,m:move)

The parts of the instruction that are composed with this rule are listed in its parameter list. The declaration of a parameter consists of an instantiation name and a reference to some other rule or to a data type (in case of an immediate operand). The description of each orthogonal part is encapsulated in a rule of its own. It often occurs that such a part is even referred to by more than one rule. In our example, the operand class {AX, AR, MR0, MR1} is subsumed in an addressing mode rule:

mode lopd=AX|AR|MR0|MR1

This rule is represented by the highlighted node N1 in FIG. 7. There are three references to this rule. One reference for opdl of alu, one for opd of shift and one for opdl of alu-shift.

For nML, a basic model of execution is presupposed: a machine executes a program consisting of a single thread of instructions. These instructions are stored in a memory from which they are fetched using a program counter (PC). Hence, the program flow can be changed by writing to the PC. Once an instruction is fetched from memory, it is decoded and the appropriate register transfers are executed. The execution of these register transfers completely determines the behavior of the machine. The effects of the execution are entirely captured in the contents of the storages at the end of a machine cycle. Thus, the storages represent the state of the machine and an instruction can be seen as a state transition function. This information is stored in the action attribute. Its value consists of a sequence of statements. (In nML, maximum possible parallelism is implicit.) A statement must be either an assignment or a conditional as shown in the following two rules. (There is also an if-then-else clause.)

```
opn shift(o:lopd,sh:int(3))
    action={
        AS = o; AR = AS << sh;
    }
opn alu(o1:lopd,o2:ropd,op:unsigned(2))
    action={
        switch op              // depending on op...
            case 0: AS = o1 + o2;   // ...a different...
            case 1: AS = o1 - o2;   // ...operation...
            case 2: AS = o1 & o2;   // ...is executed...
            case 3: AS = o1 | o2;   // ...in the alu.
        end;
        AR = AS;
    }
```

The predefined operators to form expressions include the common "C" operators plus some DSP-related extensions (e.g., exponentiation, bit rotation, bit string selection and concatenation). Other operations are easily added.

The definition of an attribute can include references to attributes defined by the parameters of the rule.

opn computemove(c:compute,m:move)

action={c.action; m.action;}

The above defines the action of computemove as the sequence of the actions of the instances of compute and move.

The binary coding and the assembly language mnemonic are captured in the image resp. the syntax attribute. The value of the image attribute is a bit string, and the value of the syntax attribute is a string.

opn computemove(c:compute,m:move)

image="0"::c.image::m.image syntax=format("%s||%s",c.syntax,m.syntax)

The image attribute attached to this rule expresses that the binary code for this instruction part consists of a fixed single bit prefix "0" concatenated with the image attributes of the two components. The definition of the syntax attribute is similar. (The function format resembles the "C" library function printf).

In addition to the aforementioned opn rules, there are rules to support the description of addressing modes. These mode rules behave similar to opn rules but have an effective address expression. The parallel data moves of our example processor use indirect addressing to compute the effective address.

mode indinc (j:card(2),k:card(2))=m[r[j]]

action={r[j]=r[j]+i[k];} image=format"0"::j::k syntax=format("(R%d++I%d)",j,k)

This rule specifies the effective address as well as some code that is used to update the address register. It is used in contexts such as:

mode adrmode=indinc|inddec opn load(r:regm,a:adrmode)

action={r=a; a.action;} image="00"::r.image::a.image

A storage element is declared by giving a name, the size and the element type. For example:

mem m[1024,int(16)]

reg r[4,fix(1,31)]

This defines a memory m of 1K with elements of 16 bit integer numbers and a four element register file r of 32 bit fixed-point numbers.

Adding a structural skeleton to nML

The foregoing discussion of modeling hardware conflicts via transitories explained how transitories model all possible hardware conflicts in the ISG. These transitories have also been added to the nML formalism, to be able to use it as a front-end to the ISG model. A transitory is declared like a register or a memory, but with the key-word trn. An nML description starts with specifying a structural skeleton of the processor at the level desired in the ISG, with exception of most read/write ports of static storage elements (see the discussion of modeling hardware conflicts via transitories). These are automatically created in the translation from nML to ISG.

Instead of complete register transfers, the action attributes now contain micro-operations connected to the storage elements to express the behavior of a partial instruction. In this way it is possible to specify, for example, different operations writing to the same transitory.

The operations in an nML description can be annotated with the functional unit on which they are executing, and delay can be attributed to the storage elements. By means of extra attributes to either the operations or the storage elements, it is in fact possible to express all information needed in the ISG.

For the description of memory and register read/write operations with different addressing mechanisms, the mode rules are used. However, the semantics of these mode rules have been changed for a better modeling of hardware conflicts. When a mode-rule is referenced in the action attribute of another rule, a distinction is made between two cases. The value can be evaluated as an l-value (a left-value, i.e., the definition of a location to be written) or as an r-value (a right-value, i.e., the definition of a location to be read). An r-value translates into a read operation between the involved static storage element and a transitory modeling its read port; an l-value into a write operation between the static storage element and its write port. Each value can be annotated with the read port and the write port to be used in the respective evaluations.

The refined semantics of the mode-rules make that each addressing mode needs only to be described once, while providing the precise modeling of possible hardware conflicts for both the read and write operations.

Use of the model by the code generation and instruction set simulation programs

Figure 8:
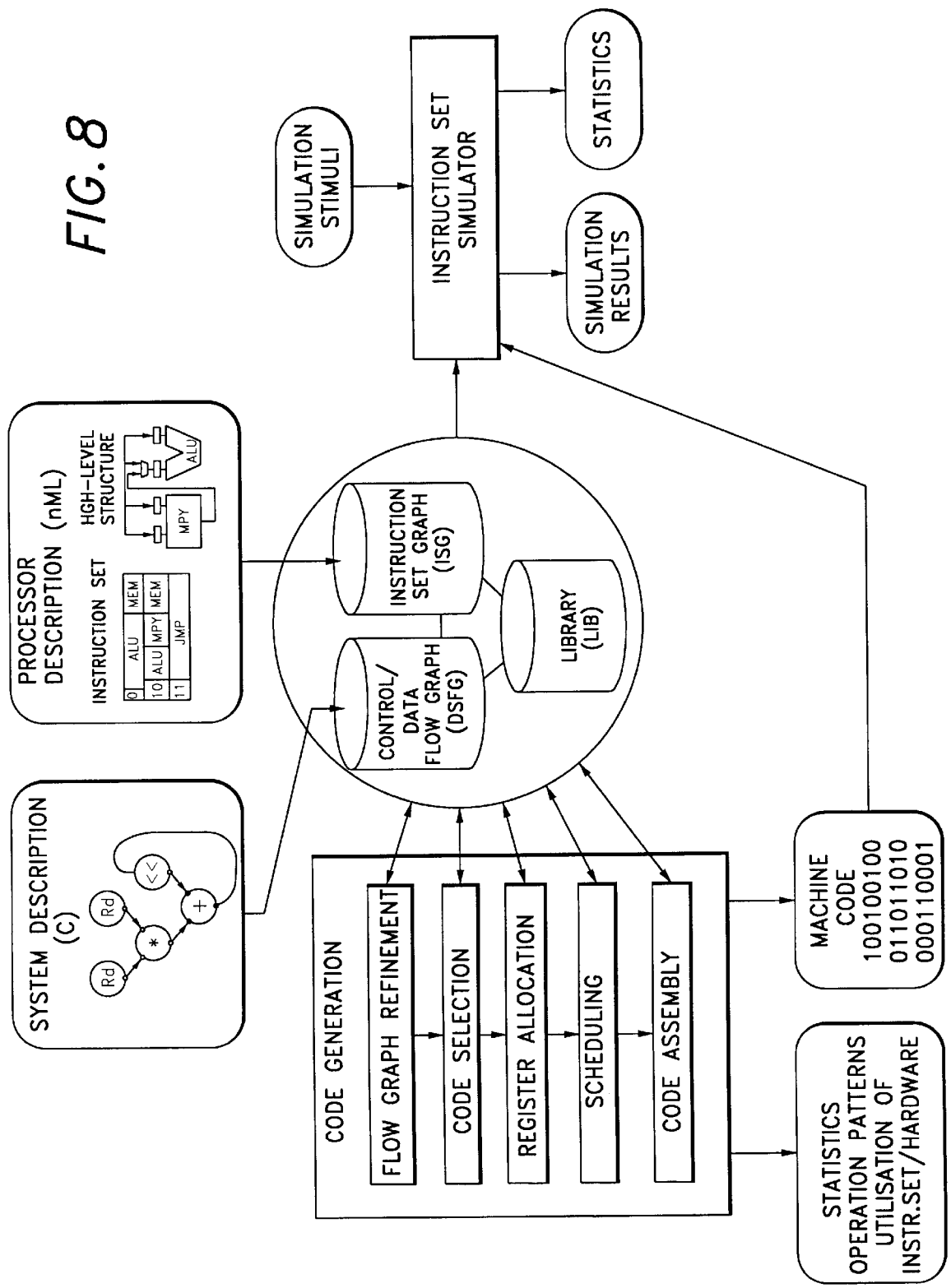
FIG. 8 illustrates an overview of the phases in the Chess retargetable code generator.

FIG. 8 illustrates an overview of the phases in a code generator in accordance with the present invention. The code generator is called Chess. The application, for which code must be generated, is written in the C-language and the processor description in nML. Both descriptions are then translated by a front-end into an internal representation, respectively the control data flow graph and the instruction set graph. All phases of the code generator work with these representations. In this section, it will be explained how the key phases in the compilation environment use the instruction set graph.

The code selection phase must find an optimized cover of the application flow graph (CDFG) with patterns of operations in the ISG. As explained before, each CDFG operation is an instance of a library operation. This library operation is the root of the decision tree containing all ISG operations which are mapping possibilities of the CDFG operation. The phase then searches for all valid paths between the mapping possibilities of data-dependent operations which do not pass static storage elements. If valid paths exist for all data-dependencies in a group of CDFG operations, this group forms a pattern in the CDFG that can be matched to one or more valid patterns in the ISG. Based on a cost function, a cover of the CDFG by valid ISG patterns is then selected.

The register allocation phase turns these patterns into register transfers by adding read and write operations, and mapping values to static storage. It searches for paths between data-dependent patterns that pass static storage. A branch-and-bound algorithm selects one of these paths, based on a cost figure which takes the capacity of the static storage elements and scheduling information into account.

The scheduling phase finally orders the register transfers, compacting them in as few instructions as possible. This phase uses the timing information of the micro-operations and the modeling of both structural and encoding conflicts, as defined above in the description of the modeling of hardware conflicts via transitories.

The instruction level simulator is an executable C++ language processor model. This C++ program is automatically generated by ordering the ISG operations in topological order, guarding them with their enabling conditions and including a bit true model for each operation. The resulting simulation is bit and cycle true.

Each of the patterns found by the code selection phase is enabled by one or more partial instructions. Different partial instructions can just provide another encoding for the pattern or possibly enable the same pattern at different places in the data-path. The code selection phase only determines which patterns will be performed in a partial instruction, not by which partial instruction nor where precisely in the data path. To communicate that information to the register allocation phase, an abstract operation for that pattern is introduced in the decision tree and the corresponding patterns in the CDFG are replaced by an instance of that abstract operation. All implementations of that pattern (corresponding to different partial instructions) in the ISG are replaced by new ISG operations and also entered in the decision tree. So the register allocation and scheduling phases can choose which partial instruction to use. In this way the code generation method supports the principle of late binding.

Although described above in connection with particular embodiments of the present invention, it should be understood the descriptions of the embodiments are illustrative of the invention and are not intended to be limiting. Various modifications and applications may occur to those skilled in the art without departing from the true spirit and scope of the invention as defined in the appended claims.

What is claimed is:

1. A method of constructing a code generator for a programmable processor being implemented in hardware and having an instruction set, said code generator being executable on a computer environment, said method comprising the steps of:

building a parse tree in the memory of said computer environment based on a specification of said processor, said specification comprising information about said hardware and about said instruction set;

transforming said parse tree into a graph representation of said processor, said graph being a directed graph having first and second sets of vertices and having edges, said step of transforming said parse tree comprising the substeps of:

analyzing said parse tree thereby identifying storage elements of said processor, and creating for each of said storage elements a vertex in said first set of vertices, said vertex representing the storage element;

analyzing said parse tree thereby identifying micro-operations of said processor, and creating for each of said micro-operations a vertex in said second set of vertices, said vertex representing the micro-operation;

analyzing said parse tree thereby identifying connections between said micro-operations and said storage elements, said connections carrying data flowing in said processor, and creating for each of said connections an edge in said graph, said edge representing the connection;

linking said graph to tools being able to generate executable code comprising ordered instructions for said processor, said instructions being determined by said tools from said graph by extracting patterns comprising at least a part of the vertices and edges from said graph, said instructions implementing said patterns.

2. The method as defined in claim 1, wherein said processor has an architecture and instruction set designed for a specific class of algorithms.

3. The method as defined in claim 1, wherein said processor has an architecture and instruction set designed for digital signal processing algorithms.

4. The method as defined in claim 1, wherein each of said storage elements comprises a list of physical storage bits in said processor.

5. The method as defined in claim 4, wherein said graph is a bipartite graph.

6. The method as defined in claim 4, wherein said graph representation represents a pair of storage elements having first and second elements which comprise sublists of same physical storage bits, said method further comprising the step of specifying an alias relationship between the vertices representing said first and second elements of said pair of storage elements.

7. The method as defined in claim 6, wherein data-types supported by a storage element are specified, said method further comprising the steps of:

specifying different vertices representing one storage element;

annotating each of said different vertices with a data type supported by said one storage element; and specifying an alias relationship between said different vertices representing said one storage element.

8. The method as defined in claim 6, wherein said processor performs residually controlled micro-operations under the control of a residual control register, said method further comprising the steps of:

representing said residual control register as a vertex of said first set of storage elements;

introducing a vertex representing the concatenation of the instruction register of said processor and said residual control register, said vertex being linked to a vertex representing said instruction register and to a vertex representing said residual control register by an alias relationship; and defining the enabling condition of each vertex of said second set of vertices representing micro-operations as bit values of said concatenation that enable the execution of the micro-operation represented by said vertex.

9. The method as defined in claim 1, wherein said code generator evaluates the optimization space of generating code for a given algorithm, said method further comprising the step of building a decision tree with vertices and branches, wherein:

vertices of said decision tree represent primitive operations, whereby said algorithm contains instances of said primitive operations;

said branches represent possible transformations of said primitive operations according to alternative mapping possibilities in said optimization space; and the set of vertices of said decision tree comprises said second set of vertices representing micro-operations of said processor.

10. The method as defined in claim 9, wherein the set of vertices of said decision tree comprises vertices representing patterns of other elements of said set, said patterns being defined during said code generation phases.

11. The method as defined in claim 1, further comprising the steps of:

representing hardware conflicts in said processor as access conflicts on said vertices representing said storage elements; and annotating each vertex of said second set of vertices representing micro-operations with their enabling condition, said enabling condition representing bit values of the instruction register of said processor that enable the execution of the micro-operation represented by said vertex.

12. The method as defined in claim 11, wherein said method determines valid partial instructions, said method further comprising the steps of:

selecting a subset of said second set of vertices representing micro-operations;

verifying that the intersection of the enabling conditions of all micro-operations of said subset is not empty; and verifying that said subset is free of access conflicts on said storage elements.

13. The method as defined in claim 1, wherein said storage elements are static and transitory storage elements.

14. The method as defined in claim 13, further comprising the step of representing all hardware conflicts in said processor as access conflicts on said vertices representing said transitory storage elements.

15. The method as defined in claim 1, wherein execution times of micro-operations are modeled, said method further comprising the step of annotating vertices representing storage elements connected to said micro-operations with integers that represent relative clock cycles at which the operands and results associated with said storage elements are consumed and produced.

16. The method as defined in claim 1, wherein said method represents a functional unit in said processor, said method further comprising the step of specifying a subset of said second set of vertices representing micro-operations, wherein all vertices in said subset execute on one functional unit.

17. The method as defined in claim 1, wherein:

said processor includes a program counter and a condition code register;

said program counter and said condition code register are represented as vertices of said first set of vertices representing storage elements; and operations manipulating contents of said program counter are represented as vertices of said second set of vertices representing micro-operations.

18. A retargetable code generator for a programmable processor implemented in hardware and having an instruction set, said retargetable code generator being executable on a computer environment and comprising:

a first tool to parse a specification of said processor to thereby build a parse tree in a memory of said computer environment, said specification comprising information about said hardware and about said instruction set;

a second tool to transform said parse tree into a graph representation of said processor, said graph being a directed graph having first and second sets of vertices and having edges, said second tool carrying out the steps of:

analyzing said parse tree thereby identifying storage elements of said processor, and creating for each of said storage elements a vertex in said first set of vertices, said vertex representing the storage element;

analyzing said parse tree thereby identifying micro-operations of said processor, and creating for each of said micro-operations a vertex in said second set of vertices, said vertex representing the micro-operation;

analyzing said parse tree thereby identifying connections between said micro-operations and said storage elements, said connections carrying data flowing in said processor, and creating for each of said connections an edge in said graph, said edge representing the connection;

tools linked to said graph, said tools being able to generate executable code comprising ordered instructions for said processor, said instructions being determined by said tools from said graph by extracting patterns comprising at least a part of the vertices and edges from said graph, said instructions implementing said patterns.

19. The retargetable code generator as defined in claim 18, wherein said graph is a bipartite graph.

20. A method of generating code for a programmable processor implemented in hardware and having an instruction set, said method comprising the steps of:

building a parse tree in memory of a computer environment based on a specification of said processor, said specification comprising information about said hardware and about said instruction set;

transforming said parse tree into a graph representation of said processor, said graph being a directed graph having first and second sets of vertices and having edges, said step of transforming said parse tree comprising the substeps of:

analyzing said parse tree thereby identifying storage elements of said processor, and creating for each of said storage elements a vertex in said first set of vertices, said vertex representing the storage element;

analyzing said parse tree thereby identifying micro-operations of said processor, and creating for each of said micro-operations a vertex in said second set of vertices, said vertex representing the micro-operation;

analyzing said parse tree thereby identifying connections between said micro-operations and said storage elements, said connections carrying data flowing in said processor, and creating for each of said connections an edge in said graph, said edge representing the connection;

linking said graph to tools, said tools being able to generate executable code comprising ordered instructions for said processor, said instructions being determined by said tools from said graph by extracting patterns comprising vertices and edges from said graph, said instructions implementing said patterns;

executing said tools, thereby generating said executable code.

21. The method as defined in claim 20, wherein said processor has an architecture and instruction set designed for a specific class of algorithms.

22. The method as defined in claim 20, wherein said processor has an architecture and instruction set designed for digital signal processing algorithms.

23. The method as defined in claim 20, wherein said processor is integrated in an application-specific integrated circuit.

24. A method of constructing a simulator that performs the simulation of the execution of code on a programmable processor implemented in hardware and having an instruction set, said simulator being executable on a computer environment, said method comprising the steps of:

building a parse tree in the memory of said computer environment based on a specification of said processor, said specification comprising information about said hardware and about said instruction set;

transforming said parse tree into a graph representation of said processor, said graph being a directed graph having first and second sets of vertices and having edges, said step of transforming said parse tree comprising the substeps of:

analyzing said parse tree thereby identifying storage elements of said processor, and creating for each of said storage elements a vertex in said first set of vertices, said vertex representing said storage element;

analyzing said parse tree thereby identifying micro-operations of said processor, and creating for each of said micro-operations a vertex in said second set of vertices, said vertex representing said micro-operation;

analyzing said parse tree thereby identifying connections between said micro-operations and said storage elements, said connections carrying data flowing in said processor, and creating for each of said connections an edge in said graph, said edge representing said connection;

linking said graph to tools and libraries, said tools being able to simulate the execution of code comprising ordered instructions for said processor, each of said instructions implementing a pattern comprising at least a part of the vertices and edges in said graph, said tools using simulation models for the operations represented by said vertices, said simulation models stored in said libraries.

25. The method as defined in claim 24, wherein said processor has an architecture and instruction set designed for a specific class of algorithms.

26. The method as defined in claim 24, wherein said processor has an architecture and instruction set designed for digital signal processing algorithms.

27. The method as defined in claim 24, wherein said processor is integrated in an application-specific integrated circuit.

28. The method as defined in claim 24, wherein each of said storage elements comprises a list of physical storage bits in said processor.

29. The method as defined in claim 28, wherein said graph representation represents a pair of storage elements having first and second elements which comprise sublists of same physical storage bits, said method further comprising the step of specifying an alias relationship between the vertices representing said first and second elements of said pair of storage elements.

30. The method as defined in claim 29, wherein data-types supported by a storage element are specified, said method further comprising the steps of:

specifying different vertices representing one storage element;

annotating each of said different vertices with a data type supported by said one storage element; and specifying an alias relationship between said different vertices representing said one storage element.

31. The method as defined in claim 29, wherein said processor performs residually controlled micro-operations under the control of a residual control register, said method further comprising the steps of:

representing said residual control register as a vertex of said first set of storage elements;

introducing a vertex representing the concatenation of the instruction register of said processor and said residual control register, said vertex being linked to a vertex representing said instruction register and to a vertex representing said residual control register by an alias relationship; and defining the enabling condition of each vertex of said second set of vertices representing micro-operations as bit values of said concatenation that enable the execution of the micro-operation represented by said vertex.

32. The method as defined in claim 24, wherein said graph is a bipartite graph.

33. The method as defined in claim 24, further comprising the step of representing hardware conflicts in said processor as access conflicts on said vertices representing said storage elements.

34. The method as defined in claim 24, wherein said storage elements are static and transitory storage elements.

35. The method as defined in claim 34, further comprising the step of representing all hardware conflicts in said processor as access conflicts on said vertices representing said transitory storage elements.

36. The method as defined in claim 24, wherein each vertex of said second set of vertices representing micro-operations is annotated with its enabling condition, said enabling condition representing bit values of the instruction register of said processor that enable the execution of the micro-operation represented by said vertex.

37. The method as defined in claim 24, wherein execution times of micro-operations are modeled, said method further comprising the step of annotating vertices representing storage elements connected to said micro-operations with integers that represent relative clock cycles at which the operands and results associated with said storage elements are consumed and produced.

38. The method as defined in claim 24, wherein said method represents a functional unit in said processor, said method further comprising the step of specifying a subset of said second set of vertices representing micro-operations, wherein all vertices in said subset execute on one functional unit.

39. The method as defined in claim 24, wherein:

said processor includes a program counter and a condition code register;

said program counter and said condition code register are represented as vertices of said first set of vertices representing storage elements; and operations manipulating contents of said program counter are represented as vertices of said second set of vertices representing micro-operations.

40. A retargetable simulator that performs the simulation of the execution of code on a programmable processor implemented in hardware and having an instruction set, said retargetable simulator being executable on a computer environment and comprising:

a first tool to parse a specification of said processor to thereby build a parse tree in a memory of said computer environment, said specification comprising information about said hardware and about said instruction set;

a tool to transform said parse tree into a graph representation of said processor, said graph being a directed graph having first and second sets of vertices and having edges, said tool carrying out the steps of:

analyzing said parse tree thereby identifying storage elements of said processor, and creating for each of said storage elements a vertex in said first set of vertices, said vertex representing said storage element;

analyzing said parse tree thereby identifying micro-operations of said processor, and creating for each of said micro-operations a vertex in said second set of vertices, said vertex representing said micro-operation;

analyzing said parse tree thereby identifying connections between said micro-operations and said storage elements, said connections carrying data flowing in said processor, and creating for each of said connections an edge in said graph, said edge representing said connection;

tools and libraries linked to said graph, said tools able to simulate the execution of code comprising ordered instructions for said processor, each of said instructions implementing a pattern comprising at least a part of the vertices and edges in said graph, said tools using simulation models for the operations represented by said vertices, said simulation models stored in said libraries.

41. The retargetable simulator as defined in claim 40, wherein said graph is a bipartite graph.

42. A method of simulating the execution of code on a programmable processor implemented in hardware and having an instruction set, said method comprising the steps of:

building a parse tree in memory of a computer environment based on a specification of said processor, said specification comprising information about said hardware and about said instruction set;

transforming said parse tree into a graph representation of said processor, said graph being a directed graph having first and second sets of vertices and having edges, said step of transforming said parse tree comprising the substeps of:

analyzing said parse tree thereby identifying storage elements of said processor, and creating for each of said storage elements a vertex in said first set of vertices, said vertex representing said storage element;

analyzing said parse tree thereby identifying micro-operations of said processor, and creating for each of said micro-operations a vertex in said second set of vertices, said vertex representing said micro-operation;

analyzing said parse tree thereby identifying connections between said micro-operations and said storage elements, said connections carrying data flowing in said processor, and creating for each of said connections an edge in said graph, said edge representing said connection;

linking said graph to tools and libraries, said tools able to simulate the execution of code comprising ordered instructions for said processor, each of said instructions implementing a pattern comprising at least a part of the vertices and edges in said graph, said tools using simulation models for the operations represented by said vertices, said simulation models stored in said libraries;

executing said tools, thereby simulating said execution of code.

43. The method as defined in claim 42, wherein said processor has an architecture and instruction set designed for a specific class of algorithms.

44. The method as defined in claim 42, wherein said processor has an architecture and instruction set designed for digital signal processing algorithms.

45. The method as defined in claim 42, wherein said processor is integrated in an application-specific integrated circuit.

* * * * *

UNITED STATES PATENT AND TRADEMARK OFFICE
CERTIFICATE OF CORRECTION

| | | |
|---|---|---|
| PATENT NO. | : 5,918,035 | Page 1 of 1 |
| APPLICATION NO. | : 08/441332 | |
| DATED | : June 29, 1999 | |
| INVENTOR(S) | : Johan Roland Van Praet et al. | |

It is certified that error appears in the above-identified patent and that said Letters Patent is hereby corrected as shown below:

On the title page, item [75] should read

[75] Inventors:  Johan Roland Van Praet, Wemmel;
Dirk Lanneer, Landen;
Gert Lodewijk Huibrecht Goossens, Leuven --;--
--Hugo De Man, Leuven--, all of Belgium.

Signed and Sealed this
Fourteenth Day of April, 2015

Michelle K. Lee
*Director of the United States Patent and Trademark Office*